(12) United States Patent
Park et al.

(10) Patent No.: US 8,637,902 B2
(45) Date of Patent: Jan. 28, 2014

(54) SEMICONDUCTOR DEVICE AND METHOD OF MANUFACTURING THE SAME

(75) Inventors: Ki Yeol Park, Suwon (KR); Woo Chul Jeon, Suwon (KR); Young Hwan Park, Seoul (KR); Jung Hee Lee, Daegu (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 310 days.

(21) Appl. No.: 12/907,653

(22) Filed: Oct. 19, 2010

(65) Prior Publication Data
US 2011/0233612 A1     Sep. 29, 2011

(30) Foreign Application Priority Data
Mar. 25, 2010   (KR) .................. 10-2010-0026804

(51) Int. Cl.
*H01L 29/737*   (2006.01)
*H01L 29/778*   (2006.01)

(52) U.S. Cl.
USPC ............. 257/194; 257/E21.403; 257/E21.407

(58) Field of Classification Search
USPC .......................... 257/194, E21.403, E21.407
See application file for complete search history.

(56) References Cited

U.S. PATENT DOCUMENTS

2008/0217625 A1*   9/2008   Kuroda et al. ................. 257/76
2011/0057231 A1*   3/2011   Jeon et al. ..................... 257/183

FOREIGN PATENT DOCUMENTS

JP          10-335637        12/1998
JP          2008-227014      9/2008

OTHER PUBLICATIONS

Anderson, Travis et al., "Advances in Hydrogen, Carbon Dioxide, and Hydrocarbon Gas Sensor Technology Using GaN and ZnO-Based Devices", Sensors, Jun. 15, 2009, vol. 9, pp. 4669-4694.

* cited by examiner

*Primary Examiner* — Ha Tran T Nguyen
*Assistant Examiner* — Raj R Gupta
(74) *Attorney, Agent, or Firm* — McDermott Will & Emery LLP

(57) ABSTRACT

There is provided a semiconductor device having a High Electron Mobility Transistor (HEMT) structure allowing for enhanced performance and a method of manufacturing the same. The semiconductor device includes a base substrate; a semiconductor layer provided on the base substrate; a source electrode, a gate electrode and a drain electrode provided on the semiconductor layer to be spaced apart from one another; and an ohmic-contact layer partially provided at an interface between the drain electrode and the semiconductor layer.

7 Claims, 4 Drawing Sheets

SEMICONDUCTOR DEVICE AND METHOD OF MANUFACTURING THE SAME

CROSS-REFERENCE TO RELATED APPLICATIONS

This application claims the priority of Korean Patent Application No. 10-2010-0026804 filed on Mar. 25, 2010, in the Korean Intellectual Property Office, the disclosure of which is incorporated herein by reference.

BACKGROUND OF THE INVENTION

1. Field of the Invention

The present invention relates to a semiconductor device, and more particularly, to a semiconductor device having a nitride-based semiconductor field effect transistor structure and a method of manufacturing the same.

2. Description of the Related Art

In general, a group III-nitride-based semiconductor including group III elements such as gallium (Ga), aluminum (Al), indium (In), and the like, and nitrogen (N), has characteristics such as a wide energy band gap, high electron mobility, high saturation electron speed, high thermochemical stability, and the like. A nitride-based field effect transistor (N-FET) based on the group III-nitride-based semiconductor is manufactured using a semiconductor material having a wide energy band gap, for example, gallium nitride (GaN), aluminum gallium nitride (AlGaN), indium gallium nitride (InGaN), aluminum indium gallium nitride (AlInGaN), or the like.

A general N-FET has a High Electron Mobility Transistor (HEMT) structure. For example, a semiconductor device having the HMET structure includes a base substrate, a nitride-based semiconductor layer formed on the base substrate, and a source electrode and a drain electrode formed on the semiconductor layer, and a gate electrode formed on the semiconductor layer between the source electrode and the drain electrode.

According to such a semiconductor device, 2-Dimensional Electron Gas (2DEG), used as a current flow path, may be generated inside the semiconductor layer. The N-FET having the above-described structure has conventionally tried to enhance internal pressure and current density at the same time by adjusting a mixing ratio of aluminum (Al) and gallium nitride (GaN) in the epitaxial growth of aluminum gallium nitride (AlGaN). However, this is related to the epitaxial growth, rather than the change of the HEMT structure. Also, there has been an attempt to increase internal pressure by forming a Schottky electrode instead of an ohmic electrode at the time of forming the drain electrode. However, the Schottky contact results in a turn-on voltage between the drain electrode and the source electrode, thereby causing a reduction in the efficiency of the semiconductor device.

SUMMARY OF THE INVENTION

An aspect of the present invention provides a semiconductor device having a High Electron Mobility Transistor (HEMT) structure allowing for enhanced performance and a method of manufacturing the same.

According to an aspect of the present invention, there is provided a semiconductor device including: a base substrate; a semiconductor layer provided on the base substrate; a source electrode, a gate electrode and a drain electrode provided on the semiconductor layer to be spaced apart from one another; and an ohmic-contact layer partially provided at an interface between the drain electrode and the semiconductor layer.

The ohmic-contact layer may include at least two ohmic grids arranged to have a predetermined interval therebetween.

The at least two ohmic grids may be arranged to have a striped form.

The at least two ohmic grids may be arranged to have a lattice form.

The ohmic-contact layer within the drain electrode may make ohmic-contact with the semiconductor layer, and a portion of the drain electrode, excepting the ohmic-contact layer, may make Schottky-contact with the semiconductor layer.

The source electrode may make ohmic-contact with the semiconductor layer and the gate electrode may make Schottky-contact with the semiconductor layer.

The semiconductor layer may include at least two different-type semiconductor layers.

The different-type semiconductor layers may have a 2-dimensional electron gas (2DEG) layer provided at an interface therebetween.

According to another aspect of the present invention, there is provided a method of manufacturing a semiconductor device, the method including: preparing a base substrate; forming a semiconductor layer on the base substrate; forming an ohmic-contact layer on a portion of the semiconductor layer; and forming a source electrode, a gate electrode and a drain electrode on the semiconductor layer to be spaced apart from one another, wherein the drain electrode includes the ohmic-contact layer formed therein.

In the forming of the ohmic-contact layer, the ohmic-contact layer may include at least two ohmic grids arranged to have a predetermined interval therebetween.

The at least two ohmic grids may be arranged to have a striped form.

The at least two ohmic grids may be arranged to have a lattice form.

In the forming of the source electrode, the gate electrode and the drain electrode, the source electrode may make ohmic-contact with the semiconductor layer, and the gate electrode may make Schottky-contact with the semiconductor layer. The ohmic-contact layer within the drain electrode may make ohmic-contact with the semiconductor layer and a portion of the drain electrode, excepting the ohmic-contact layer, may make Schottky-contact with the semiconductor layer.

In the forming of the semiconductor layer, the semiconductor layer may include at least two different-type semiconductor layers.

The different-type semiconductor layers may have a 2-dimensional electron gas (2DEG) layer provided at an interface therebetween.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1A:
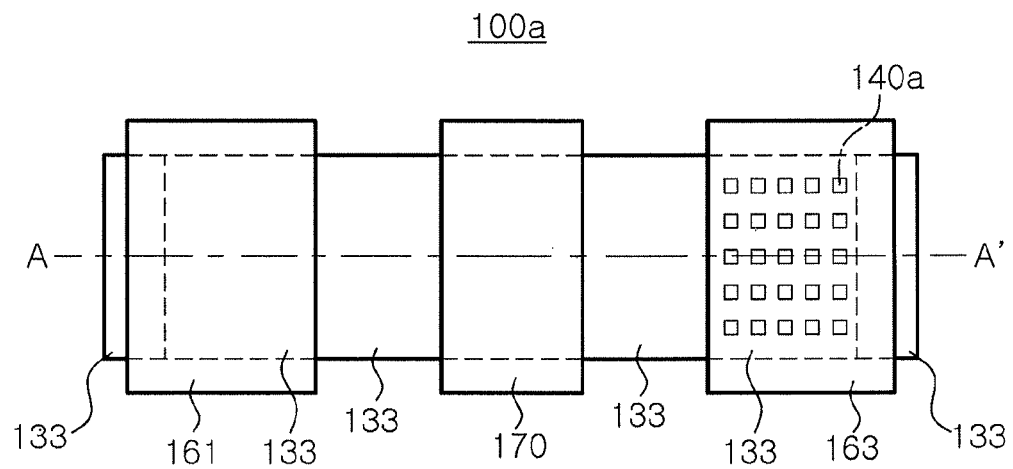
FIG. 1A is a plan view illustrating a semiconductor device according to a first exemplary embodiment of the present invention.

Various advantages and features of the present invention and a method thereof will become apparent from the following description of exemplary embodiments with reference to the accompanying drawings. However, the present invention may be modified in many different manners and should not be construed as being limited to the exemplary embodiments set forth herein. Rather, these exemplary embodiments may be provided so that this disclosure will be thorough and complete, and will fully convey the scope of the invention to those having skill in the art. Throughout the drawings, the same reference numerals will be used to designate the same or like elements.

Terms used in the present specification are used so as to explain the exemplary embodiments rather than limiting the present invention thereto. Unless explicitly described to the contrary, a singular form includes a plural form in the present specification. The word "include" and variations such as "includes" or "including," will be understood to imply the inclusion of stated constituents, steps, operations and/or elements but not the exclusion of any other constituents, steps, operations and/or elements.

Further, the exemplary embodiments described in the specification will be described with reference to cross-sectional views and/or plan views that are ideal exemplification figures. In the drawings, the thickness of layers and regions may be exaggerated for efficient description of technical contents, and consequently, exemplified forms may be changed by manufacturing technologies and/or tolerances. Therefore, the exemplary embodiments of the present invention are not limited to specific forms but may include a change in forms generated according to the manufacturing processes. For example, an etching region shown vertically may be rounded or may have a predetermined curvature. Therefore, the regions shown in the drawings have schematic attributes and the shapes shown in the drawings show specific shapes of device regions by way of example only, but are not limited to the scope of the invention.

Hereinafter, a semiconductor device and a method of manufacturing the same according to exemplary embodiments of the present invention will be described in detail with reference to the accompanying drawings.

Figure 1B:
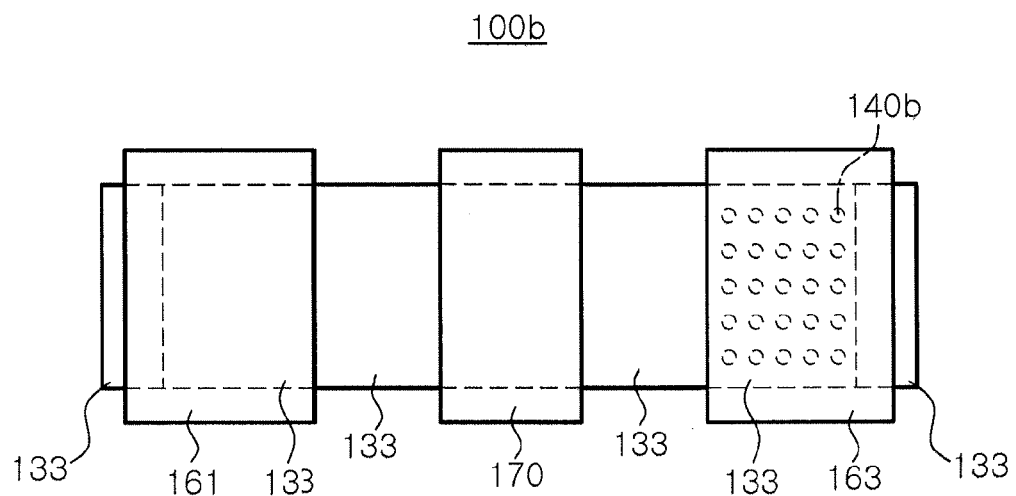
FIG. 1B is a plan view illustrating a semiconductor device according to a second exemplary embodiment of the present invention.
Figure 1C:
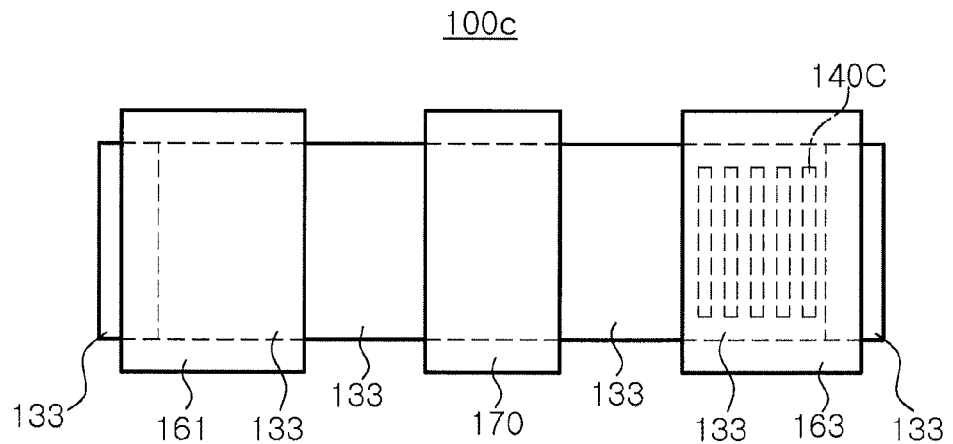
FIG. 1C is a plan view illustrating a semiconductor device according to a third exemplary embodiment of the present invention.
Figure 2:
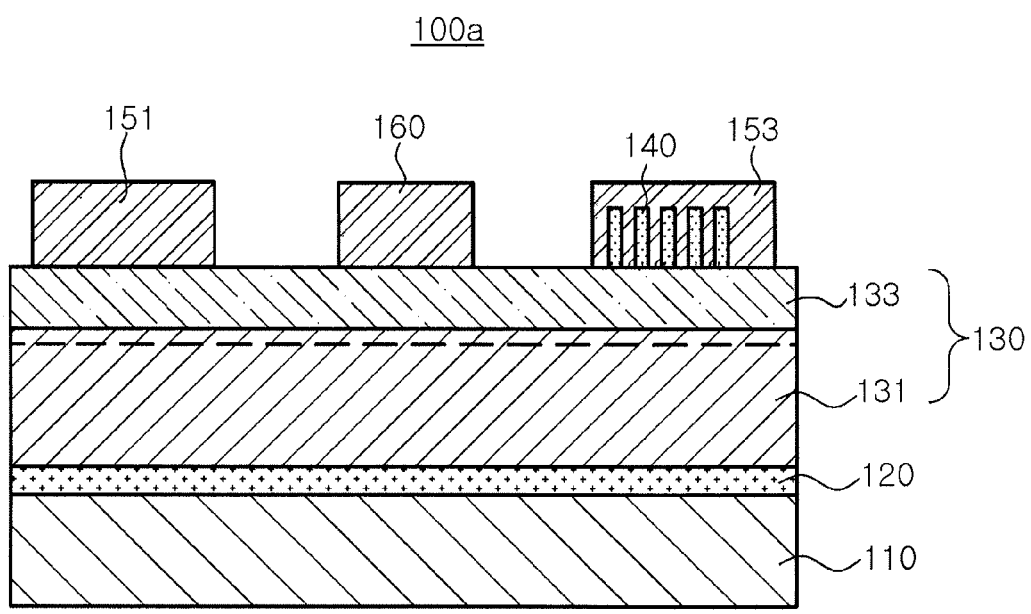
FIG. 2 is a cross-sectional view taken along line A-A' of FIG. 1A.

FIG. 1A is a plan view illustrating a semiconductor device according to a first exemplary embodiment of the present invention. FIG. 1B is a plan view illustrating a semiconductor device according to a second exemplary embodiment of the present invention. FIG. 1C is a plan view illustrating a semiconductor device according to a third exemplary embodiment of the present invention. FIG. 2 is a cross-sectional view taken along line A-A' of FIG. 1A.

With reference to FIGS. 1A through 2, a semiconductor device 100a according to the first exemplary embodiment of the invention may include a base substrate 110, a buffer layer 120, a semiconductor layer 130, a source electrode 151, a gate electrode 160, a drain electrode 153, and an ohmic-contact layer 140 partially formed at the interface between the drain electrode 153 and the semiconductor layer 130.

The base substrate 110 may be a plate for forming a semiconductor device having a High Electron Mobility Transistor (HEMT) structure. For example, the base substrate 100 may be a semiconductor substrate. As an example, the base substrate 110 may be at least any one of a silicon substrate, a silicon carbide substrate, and a sapphire substrate.

Next, the buffer layer 120 may be disposed on the base substrate 110. As an example, the buffer layer 120 may be formed of an aluminum nitride (AlN) layer; however, the buffer layer 120 is not limited thereto. Herein, the buffer layer 120 may be provided to solve the problems caused due to a lattice mismatch between the base substrate 110 and the semiconductor layer 130 to be subsequently formed.

The semiconductor layer 130 may be disposed on the buffer layer 120. The semiconductor layer 130 may include at least two different-type semiconductor layers that are a lower semiconductor layer 131 and an upper semiconductor layer 133. For example, the different-type semiconductor layers 131 and 133 may be arranged such that the lower semiconductor layer 131 is a p-type high resistance layer or p-type gallium nitride (GaN) layer and the upper semiconductor layer 133 is an n-type aluminum gallium nitride (AlGaN) layer. In this case, a 2-dimensional electron gas (2DEG) layer may be formed at the interface between the aluminum gallium nitride (AlGaN) layer and the gallium nitride (GaN) layer.

The source electrode 151, the gate electrode 160 and the drain electrode 153 may be provided on the semiconductor layer 130 to be spaced apart from each other. The source electrode 151 and the drain electrode 153 may be spaced apart from each other having the gate electrode 160 intervening therebetween. The ohmic-contact layer 140 may be partially formed at the interface between the drain electrode 153 and the semiconductor layer 130.

Here, the ohmic-contact layer 140 may include at least two ohmic grids arranged to have a predetermined interval therebetween.

The ohmic-contact layer 140 may have various shapes and arrangements. For example, an ohmic-contact layer 140a according to the first exemplary embodiment of the present invention as shown in FIG. 1A, has a sectional surface, each of the at least two ohmic grids thereof having a quadrilateral shape, and arranged in the form of a lattice. As shown in FIG. 1B, an ohmic-contact layer 140b according to the second exemplary embodiment of the present invention has a sectional surface, each of the at least two ohmic grids thereof having a circular or oval shape, and arranged in the form of a lattice. As shown in FIG. 1C, an ohmic-contact layer 140c according to the third exemplary embodiment of the present invention has a sectional surface, each of the at least two ohmic grids thereof having a rectangular shape, and arranged in the form of stripes. However, the shapes and arrangements of the ohmic-contact layer 140 are not limited thereto, and may be modified to have various forms.

Herein, the source electrode 151 makes ohmic-contact with the semiconductor layer 130 and the gate electrode 160 makes Schottky-contact with the semiconductor layer 130. Also, within the drain electrode 153, the ohmic-contact layer 140 makes ohmic-contact with the semiconductor layer 130 and portions thereof, excepting the ohmic-contact layer 140, make Schottky-contact with the semiconductor layer 130.

In this manner, the semiconductor device according to the present invention allows for the formation of a Schottky drain electrode including the ohmic-contact layer without additional processes by forming the ohmic-contact layer to be within the drain electrode and then forming the drain electrode at the time of forming the gate electrode concurrently, thereby increasing internal pressure and reducing turn-on resistance as compared with a conventional electrode. This produces an effect of enhancing switching efficiency.

A method of manufacturing the semiconductor device according to the above-described embodiments of the invention will hereinafter be described. Repeated descriptions of the semiconductor device according to the above-described embodiments of the invention will be omitted and simplified.

FIGS. 3 through 7 illustrate a method of manufacturing a semiconductor device according to an exemplary embodiment of the invention.

Figure 3:
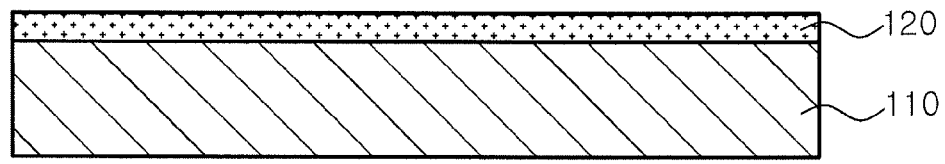
FIGS. 3 through 7 are cross-sectional views illustrating a method of manufacturing the semiconductor device according to the first exemplary embodiment of the present invention.

As shown in FIG. 3, the base substrate 110 is prepared. As the base substrate 110, a semiconductor substrate may be used. For example, the semiconductor substrate 100 may be at least any one of a silicon substrate, a silicon carbide substrate, and a sapphire substrate. However, the base substrate 110 is not limited thereto.

Subsequently, the buffer layer 120 may be formed on the base substrate 110.

Figure 4:
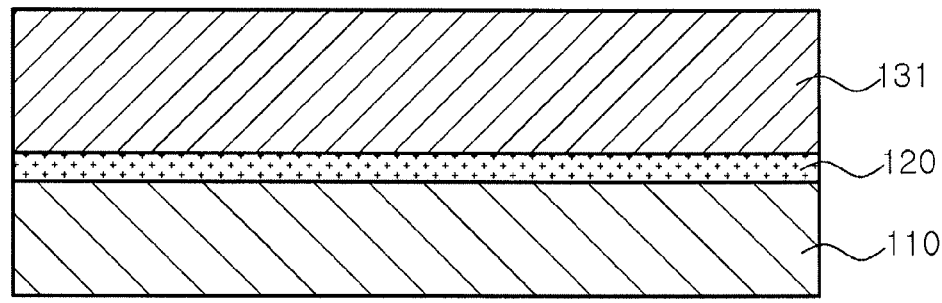
Figure 5:
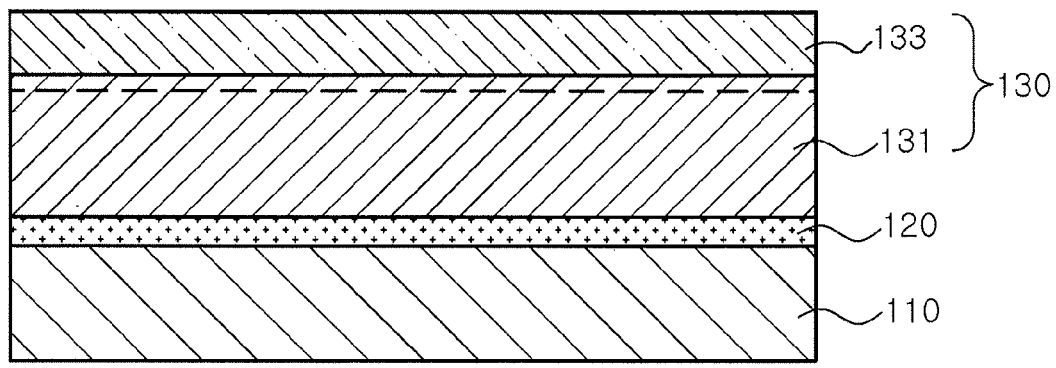

Next, as shown in FIGS. 4 and 5, the lower semiconductor layer 131 and the upper semiconductor layer 133 may be successively formed in order on the buffer layer 120.

The semiconductor layer 130 may be formed in a manner that the lower semiconductor layer 131 is epitaxially grown by using the buffer layer 120 as a seed layer, and then the upper semiconductor layer 133 is grown by using the lower semiconductor layer 131 as a seed layer.

For example, the different-type semiconductor layers 131 and 133 may be arranged such that the lower semiconductor layer 131 is a p-type high resistance layer or p-type gallium nitride (GaN) layer and the upper semiconductor layer 133 is an n-type aluminum gallium nitride (AlGaN) layer. In this case, a 2DEG layer may be formed at the interface between the gallium nitride (GaN) layer and the aluminum gallium nitride (AlGaN) layer.

As an epitaxial growth process for forming the n-type aluminum gallium nitride (AlGaN) layer and the p-type high resistance layer or p-type gallium nitride (GaN) layer, at least any one of a molecular beam epitaxial growth process, an atomic layer epitaxial growth process, a flow modulation organometallic vapor phase epitaxial growth process, an organometallic vapor phase epitaxial growth process, and a hybrid vapor phase epitaxial growth process may be used. In another example, as a process for forming the aluminum gallium nitride (AlGaN) layer and the gallium nitride (GaN) layer, any one of a chemical vapor deposition process and a physical vapor deposition process may be used.

Figure 6:
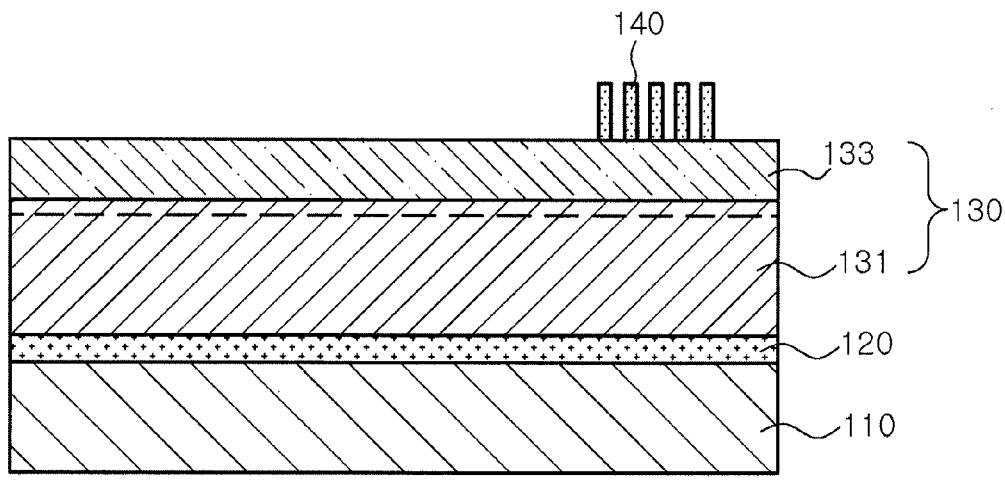

Thereafter, as shown in FIG. 6, the ohmic-contact layer 140 may be formed on the upper semiconductor layer 133. After a first metal layer and a second metal layer formed of a material different from the first metal layer are formed on the upper semiconductor layer 133, a predetermined photoresist etching process is performed to thereby form the ohmic-contact layer 140.

Figure 7:
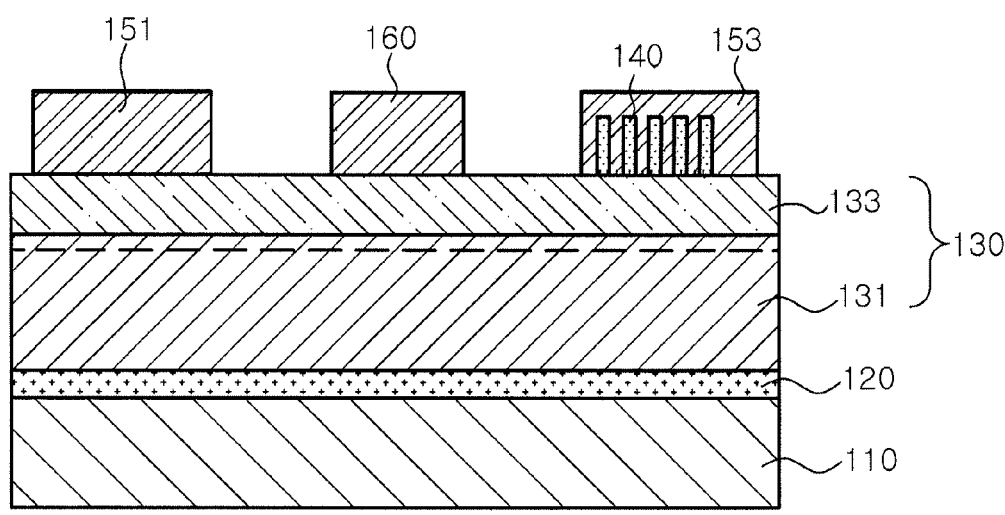

Next, as shown in FIG. 7, the source electrode 151, the gate electrode 160, and the drain electrode 153 may be formed on the semiconductor layer 130 to be spaced apart from one another. The ohmic-contact layer 140 may be partially formed at the interface between the drain electrode 153 and the semiconductor layer 130.

Here, the ohmic-contact layer 140 may include at least two ohmic grids arranged to have a predetermined interval therebetween.

The ohmic-contact layer 140 may have various shapes and arrangements. For example, the ohmic-contact layer 140a according to the first exemplary embodiment of the invention as shown in FIG. 1A, has a sectional surface, each of the at least two ohmic grids thereof having a quadrilateral shape, and arranged in the form of a lattice. As shown in FIG. 1B, the ohmic-contact layer 140b according to the second exemplary embodiment of the invention has a sectional surface, each of the at least two ohmic grids thereof having a circular or oval shape, and arranged in the form of a lattice. As shown in FIG. 1C, the ohmic-contact layer 140c according to the third exemplary embodiment of the invention has a sectional surface, each of the at least two ohmic grids thereof having a rectangular shape, and arranged in the form of stripes. However, the shapes and arrangements of the ohmic-contact layer 140 are not limited thereto, and may be modified to have various forms.

Herein, the source electrode 151 makes ohmic-contact with the semiconductor layer 130 and the gate electrode 160 makes Schottky-contact with the semiconductor layer 130. Also, within the drain electrode 153, the ohmic-contact layer 140 makes ohmic-contact with the semiconductor layer 130 and portions thereof, excepting the ohmic-contact layer 140, make Schottky-contact with the semiconductor layer 130.

In this manner, the semiconductor device according to the present invention allows for the formation of a Schottky drain electrode including the ohmic-contact layer without additional processes by forming the ohmic-contact layer to be within the drain electrode and then forming the drain electrode at the time of forming the gate electrode concurrently, thereby increasing internal pressure and reducing turn-on resistance as compared with a conventional electrode. This produces an effect of enhancing switching efficiency.

As set forth above, according to exemplary embodiments of the invention, there is provided a semiconductor device having a High Electron Mobility Transistor (HEMT) structure allowing for enhanced performance and a method of manufacturing the same.

In addition, a semiconductor device according to exemplary embodiments of the invention allows for the formation of a Schottky drain electrode including an ohmic-contact layer without additional processes by forming the ohmic-contact layer to be within a drain electrode and then forming the drain electrode at the time of forming a gate electrode concurrently, thereby increasing internal pressure and reducing turn-on resistance as compared with a conventional electrode. This produces an effect of enhancing switching efficiency.

The present invention has been described in connection with what is presently considered to be practical exemplary embodiments. Although the exemplary embodiments of the present invention have been described, the present invention may be also used in various other combinations, modifications and environments. In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present invention. Therefore, they may be carried out in other states known to the field to which the present invention pertains in using other inventions and also be modified in various forms required in specific application fields and usages of the invention. Therefore, it is to be understood that the invention is not limited to the disclosed exemplary embodiments. It is to be understood that other exemplary embodiments are also included within scope of the appended claims.

What is claimed is:

1. A semiconductor device comprising:
   a base substrate;
   a semiconductor layer provided on the base substrate;
   a source electrode, a gate electrode and a drain electrode provided on the semiconductor layer to be spaced apart from one another; and
   an ohmic-contact layer formed within the drain electrode and partially provided at an interface between the drain electrode and the semiconductor layer,
   wherein the ohmic contact layer is formed of a first material which makes ohmic contact with the semiconductor layer, and
   wherein the drain electrode is formed of a second material which makes Schottky-contact with the semiconductor layer.

2. The semiconductor device of claim 1, wherein the source electrode makes ohmic-contact with the semiconductor layer, and the gate electrode makes Schottky-contact with the semiconductor layer.

3. The semiconductor device of claim 1, wherein the ohmic-contact layer includes at least two ohmic grids arranged to have a predetermined interval therebetween.

4. The semiconductor device of claim 3, wherein the at least two ohmic grids are arranged to have a striped form.

5. The semiconductor device of claim 3, wherein the at least two ohmic grids are arranged to have a lattice form.

6. The semiconductor device of claim 1, wherein the semiconductor layer includes at least two different-type semiconductor layers.

7. The semiconductor device of claim 6, wherein the different-type semiconductor layers have a 2-dimensional electron gas (2DEG) layer provided at an interface therebetween.

* * * * *